(12) United States Patent
Ma et al.

(10) Patent No.: US 7,929,288 B1
(45) Date of Patent: Apr. 19, 2011

(54) COMPUTER

(75) Inventors: Xiao-Feng Ma, Shenzhen (CN); An-Gang Liang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/649,349

(22) Filed: Dec. 30, 2009

(30) Foreign Application Priority Data

Nov. 24, 1999 (CN) .......................... 2009 1 0310315

(51) Int. Cl.
*H05K 5/00* (2006.01)
*H05K 7/00* (2006.01)

(52) U.S. Cl. ......... 361/679.32; 361/679.31; 361/679.46; 361/679.51

(58) Field of Classification Search ............. 361/679.31, 361/679.32, 679.46, 679.51
See application file for complete search history.

(56) References Cited

U.S. PATENT DOCUMENTS

| 6,138,839 | A | * | 10/2000 | Cranston et al. | ........... | 211/41.17 |
| 6,357,603 | B1 | * | 3/2002 | Dingman | ................... | 211/41.17 |
| 6,674,650 | B1 | * | 1/2004 | Davis et al. | ................... | 361/796 |
| 7,826,211 | B2 | * | 11/2010 | Liu | ............................ | 361/679.4 |

* cited by examiner

*Primary Examiner* — Jayprakash N Gandhi
*Assistant Examiner* — Anthony M Haughton
(74) *Attorney, Agent, or Firm* — Zhigang Ma

(57) ABSTRACT

A computer includes an enclosure, a motherboard, at least one expansion card, a supporting bracket, and at least one first baffle plate and at least one second baffle plate. The at least one expansion card is inserted into the corresponding expansion slot. The bracket is located above and spaced from the motherboard by a spacing. The at least one first baffle plate and at least one second baffle plate are arranged along an extension direction of the supporting bracket and extending between the bracket and the motherboard. The at least one first baffle plate covers a part of the spacing between the bracket and the motherboard. The at least one second baffle plate covers another part of the spacing between the bracket and the motherboard. The at least one first baffle plate and the at least one second baffle plate define a plurality of through holes therein.

10 Claims, 4 Drawing Sheets

COMPUTER

BACKGROUND

1. Technical Field

The present disclosure relates to computers, and particularly to a computer having at least one expansion card mounted therein.

2. Description of Related Art

Typically, one or more expansion slots and expansion cards are disposed on a motherboard of a computer for connecting external chip modules. An inner space of the computer is divided into an expansion card area and a non-expansion card area via a plurality of baffle plates. However, the baffle plates hinder air convection in the computer thereby decreasing a heat dissipating efficiency of the computer.

Therefore, a new type of computer is desired to overcome the above described shortcoming.

DETAILED DESCRIPTION

Figure 1:
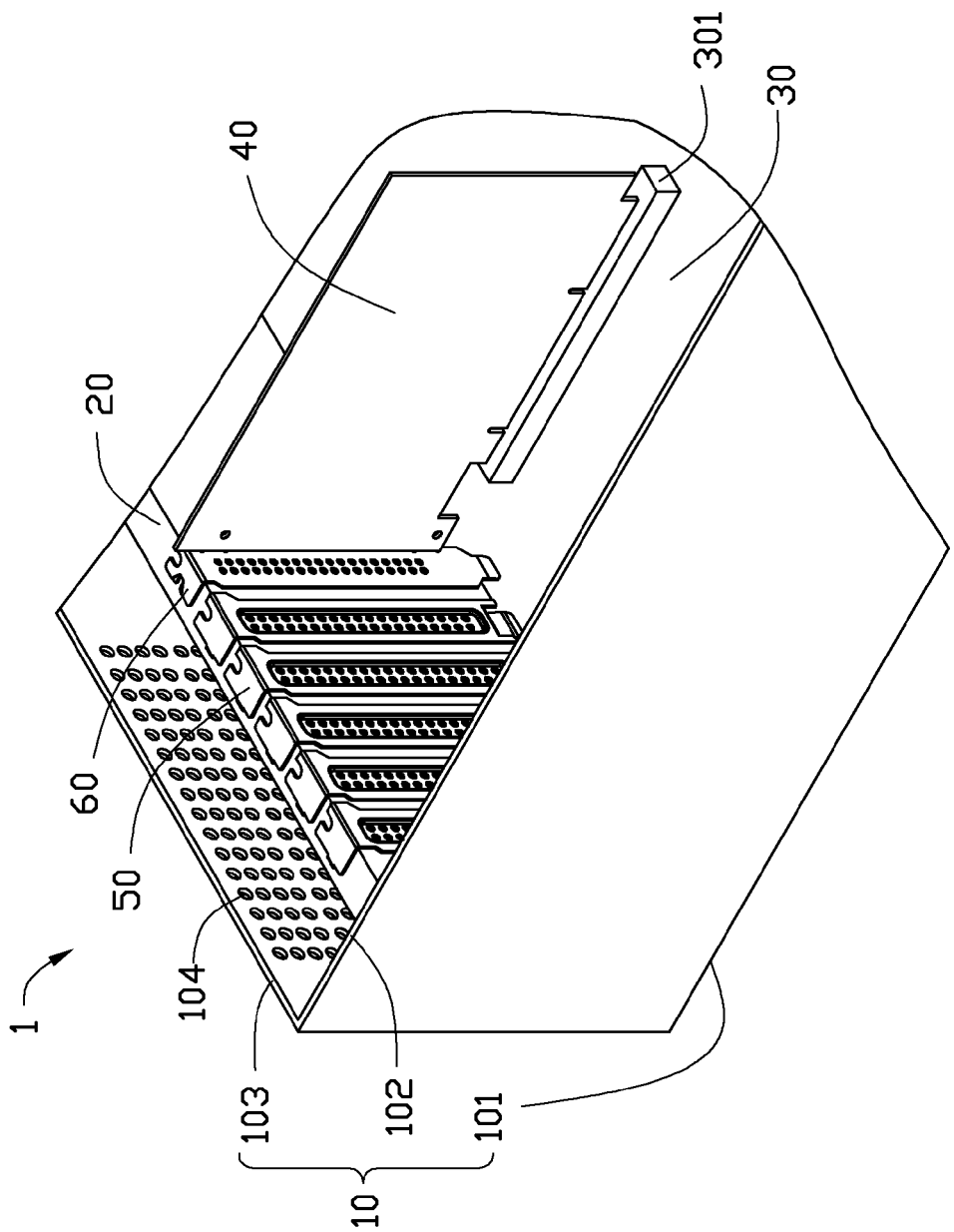
FIG. 1 is an isometric view of a computer including a plurality of first baffle plates, a second baffle plate, and an expansion card in accordance with an embodiment of the present disclosure.
Figure 2:
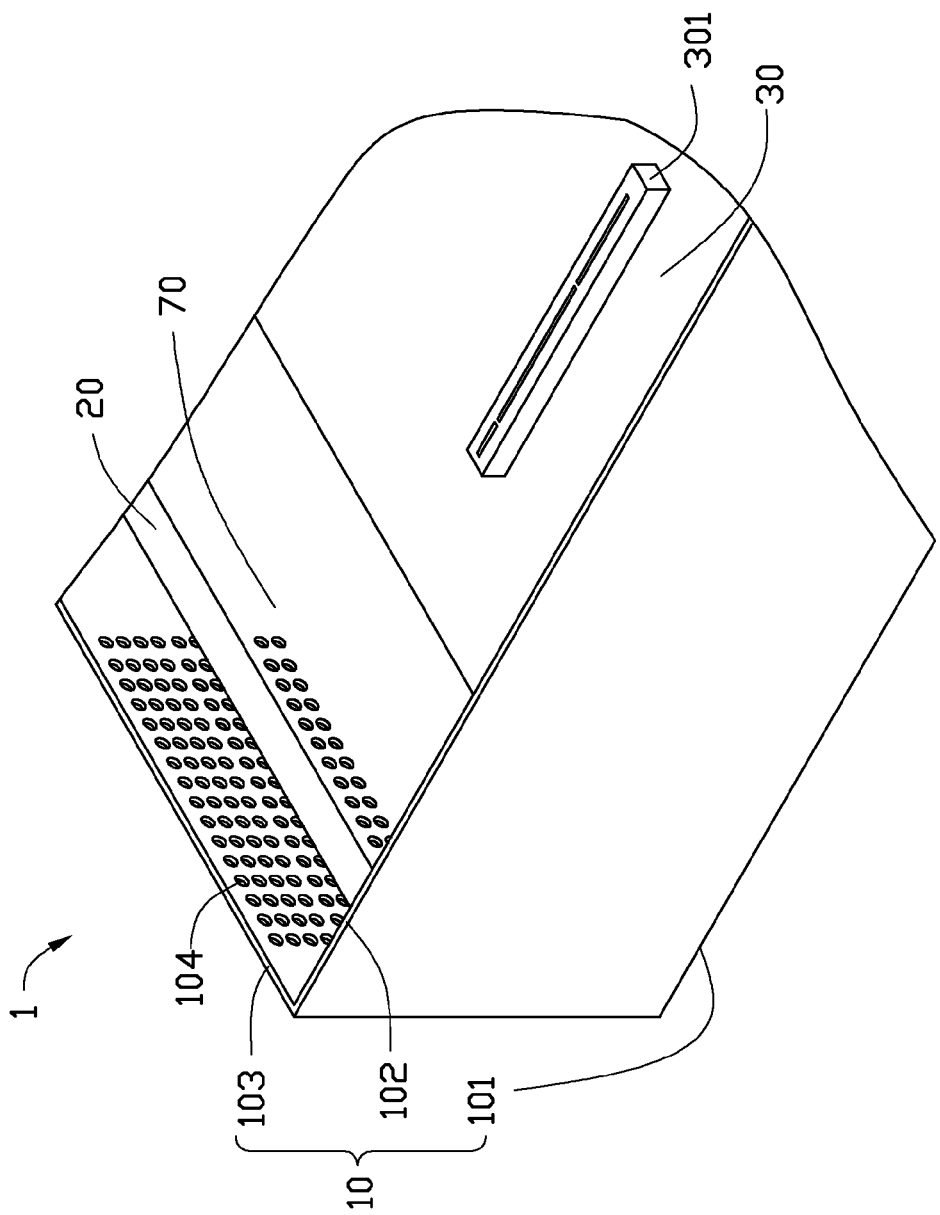
FIG. 2 is similar to FIG. 1, but without the first baffle plates, the second baffle plate, and the expansion card.

FIGS. 1-2 show a computer 1 in accordance with an embodiment of the present disclosure. The computer 1 includes an enclosure 10, a motherboard 30, a plurality of first baffle plates 50, a second baffle plate 60, and an expansion card 40. The enclosure 10 includes a bottom plate 101, a first side plate 102, and a second side plate 103. The first side plate 102 and the second side plate 103 extend up from an outer edge of the bottom plate 101. The first side plate 102 and the second side plate 103 are connected to each other at a corner of the enclosure 10. The second side plate 103 defines a plurality of ventilating holes 104. The motherboard 30 is mounted on the bottom plate 101. An expansion slot 301 corresponding to the expansion card 40 is formed on the motherboard 30. A bottom of the expansion card 40 is inserted into the expansion slot 301. In the illustrated embodiment, the expansion card 40 is a peripheral component interconnection (PCI) expansion card and the expansion slot 301 is a PCI expansion slot.

A supporting bracket 20 is disposed in the enclosure 10. The bracket 20 is located above and spaced vertically from the motherboard 30. The bracket 20 extends horizontally from the first side plate 102 into the enclosure 10. The bracket 20 is parallel to the second side plate 103 but perpendicular to the expansion slot 301. The bracket 20 is parallel to and spaced from the motherboard 30 whereby the bracket 20 and the motherboard 30 define a spacing 70 therebetween. The first baffle plates 50 and the second baffle plate 60 are arranged as a line along the extensional direction of the bracket 20. The first baffle plates 50 cover a part of the spacing 70 between the bracket 20 and the motherboard 30. The second baffle plate 60 covers another part (i.e., the remaining part) of the spacing 70 between the bracket 20 and the motherboard 30.

Figure 3:
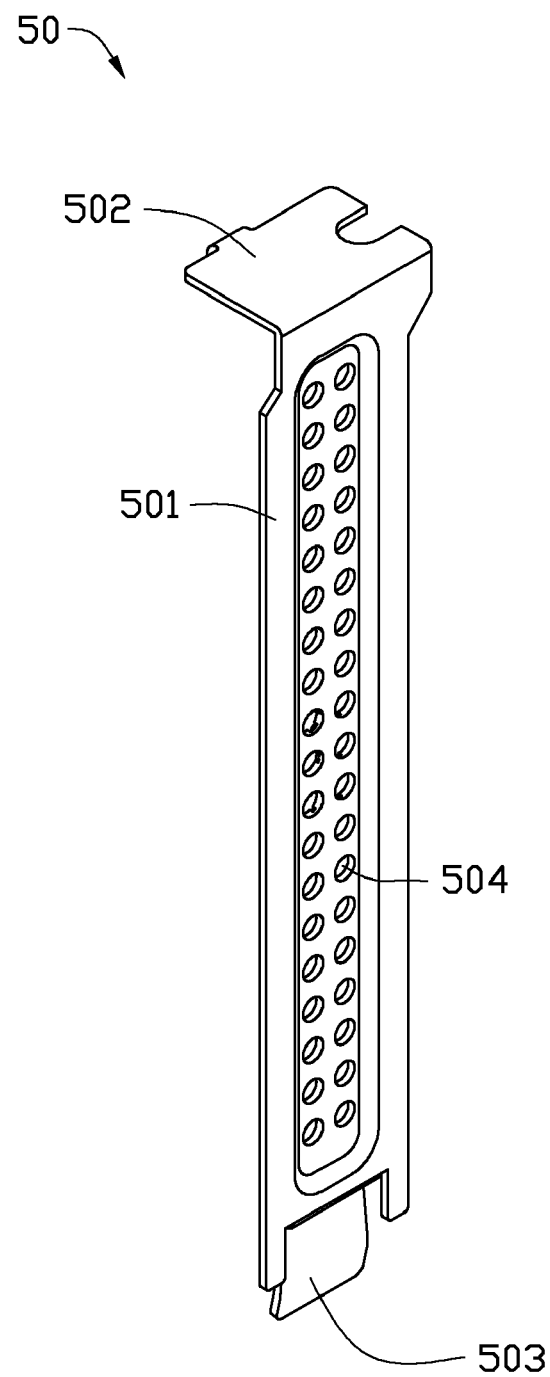
FIG. 3 is an isometric view of one of the first baffle plates of FIG. 1.

Referring also to FIG. 3, each of the first baffle plates 50 includes a first main body 501, a first flange 502, and a first protrusion 503. The first main body 501 is elongated and defines two rows of first through holes 504. The first flange 502 extends from a top of the first main body 501 toward the bracket 20. The first protrusion 503 is formed at a bottom of the first main body 501 by punching. The first flange 502 of the first baffle plate 50 is fixed on the bracket 20, and the first protrusion 503 of the first baffle plate 50 is fixed on the motherboard 30.

Figure 4:
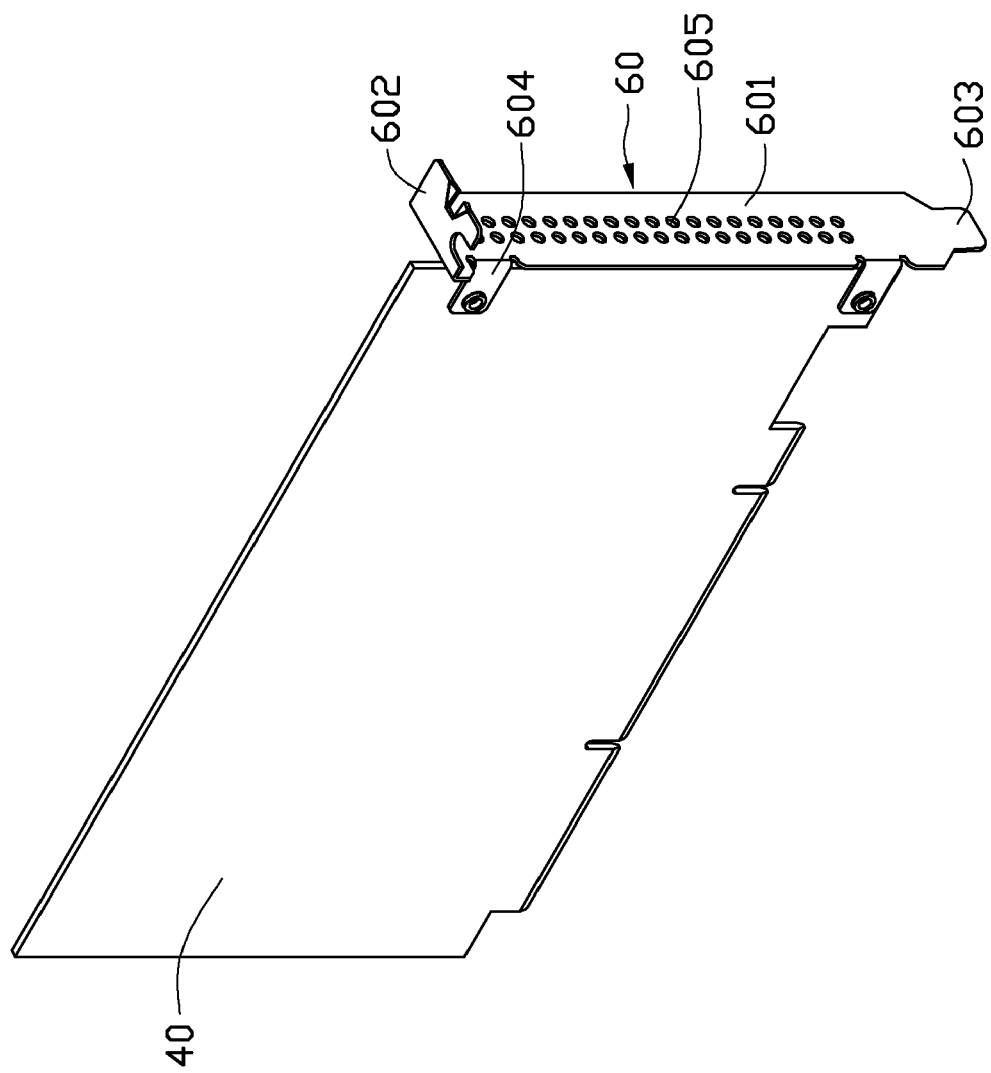
FIG. 4 is an assembled view of the expansion card and the second baffle plate of FIG. 1.

Referring also to FIG. 4, the second baffle plate 60 includes a second main body 601, a second flange 602 and a second protrusion 603. The second main body 601 is elongated and defines two rows of second through holes 605. The second flange 602 extends from a top of the second main body 601 toward the bracket 20. The second protrusion 603 is formed at a bottom of the second main body 601 by punching. Two securing ears 604 extend from a left edge of the second main body 601 toward the expansion card 40. The second flange 602 of the second baffle plate 60 is fixed on the bracket 20, and the second protrusion 603 of the second baffle plate 60 is fixed on the motherboard 30. The two securing ears 604 are connected to a front end of the expansion card 40. A diameter of each of the first through holes 504 and the second through holes 605 is less than 3.5 millimeters to satisfy the electro magnetic interference (EMI) requirement.

The expansion card area of the computer 1 in which the expansion card 40 is received communicates with the neighboring non-expansion card area of the computer 1 defined between the second side plate 103 and the bracket 20 via the first and second through holes 504, 605 of the first and second baffle plates 50, 60, whereby air can smoothly flow between the expansion card area and the neighboring non-expansion card area of the computer 1 to take heat away from the expansion card 40. Thus, thermal resistance of the computer 1 is decreased. Furthermore, the first through holes 504 and the second through holes 605 face the ventilating holes 104 of the second side plate 103 of the enclosure 10, whereby air flows through the enclosure 10 and out of the computer 1 freely. Thus, a heat dissipating efficiency of the computer 1 is improved.

It is to be understood, however, that even though numerous characteristics and advantages of the disclosure have been set forth in the foregoing description, together with details of the structures and functions of the embodiment(s), the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A computer, comprising:

an enclosure;

a motherboard with at least one expansion slot formed thereon, the motherboard being disposed in the enclosure;

at least one expansion card corresponding to the at least one expansion slot and being inserted into a corresponding one of the at least one expansion slot;

a supporting bracket being disposed in the enclosure, the bracket being located above and spaced from the motherboard by a spacing; and at least one first baffle plate and at least one second baffle plate being arranged along an extension direction of the supporting bracket and extending between the bracket and the motherboard, the at least one first baffle plate covering a part of the spacing between the bracket and the motherboard, the at least one second baffle plate covering another part of the spacing between the bracket and the motherboard, the at least one second baffle plate each connecting with one end of a corresponding expansion card, the at least one first baffle plate and the at least one second baffle plate defining a plurality of through holes therein, the plurality of through holes facing the spacing;

wherein an inner space of the enclosure is divided into an expansion card area and a non-expansion card area via the at least one first baffle plate and the at least one second baffle plate, the at least one expansion card is received in the expansion card area, and the expansion card area communicates with the non-expansion card area via the plurality of through holes of the at least one first baffle plate and the at least one second baffle plate, whereby air can flow smoothly between the expansion card area and the non-expansion card area and take heat away from the expansion card.

2. The computer of claim 1, wherein the through holes are defined in each of the at least one first baffle plate.

3. The computer of claim 1, wherein the through holes are defined in each of the at least one second baffle plate.

4. The computer of claim 1, wherein the through holes are defined in each of the at least one first baffle plate and in each of the at least one second baffle plate.

5. The computer of claim 1, wherein the enclosure defines a plurality of ventilating holes, and the through holes face the ventilating holes.

6. The computer of claim 1, wherein the at least one first baffle plate each includes a first main body, a first flange and a first protrusion, the first flange extends from a top of the first main body toward the supporting bracket, the first protrusion is formed at a bottom of the first main body, the first flange of the first baffle plate is fixed on the supporting bracket, and the first protrusion of the first baffle plate is fixed on the motherboard.

7. The computer of claim 1, wherein the at least one second baffle plate each includes a second main body, a second flange and a second protrusion, the second flange extends from a top of the second main body toward the supporting bracket, the second protrusion is formed at a bottom of the second main body, two securing ears extend from the second main body toward the expansion card, the second flange of the second baffle plate is fixed on the supporting bracket, the second protrusion of the second baffle plate is fixed on the motherboard, and the two securing ears are connected to the expansion card.

8. The computer of claim 1, wherein a diameter of each of the through holes is less than 3.5 millimeters.

9. The computer of claim 1, wherein each of the at least one first baffle plate is elongated.

10. The computer of claim 1, wherein each of the at least one second baffle plate is elongated.

\* \* \* \* \*